United States Patent
Aoike

(10) Patent No.: US 7,215,157 B2
(45) Date of Patent: May 8, 2007

(54) SMALL-AMPLITUDE DIFFERENTIAL INTERFACE CIRCUIT

(75) Inventor: Masahiro Aoike, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/889,034

(22) Filed: Jul. 13, 2004

(65) Prior Publication Data

US 2005/0083101 A1  Apr. 21, 2005

(30) Foreign Application Priority Data

Oct. 15, 2003  (JP) .............................. 2003-354738

(51) Int. Cl.
*H03K 5/22* (2006.01)
*H03K 5/153* (2006.01)

(52) U.S. Cl. .......................................... 327/63; 327/89
(58) Field of Classification Search ................ 327/52, 327/78–82, 85, 89, 108, 563
See application file for complete search history.

(56) References Cited

U.S. PATENT DOCUMENTS

| | | | |
|---|---|---|---|
| 5,418,478 A | | 5/1995 | Van Brunt et al. |
| 5,530,444 A | * | 6/1996 | Tice et al. .................... 341/156 |
| 5,614,860 A | * | 3/1997 | Osaki et al. ................. 327/552 |
| 5,736,892 A | * | 4/1998 | Lee .............................. 327/536 |
| 6,005,439 A | * | 12/1999 | Fong ........................... 330/253 |
| RE36,781 E | * | 7/2000 | Lee et al. ....................... 327/65 |
| 6,111,431 A | | 8/2000 | Estrada |
| RE37,452 E | * | 11/2001 | Donnelly et al. ............ 327/255 |
| 6,313,662 B1 | | 11/2001 | Ide |
| 6,664,910 B1 | * | 12/2003 | Mulder et al. ............... 341/158 |
| 6,714,075 B2 | | 3/2004 | Morie et al. |
| 6,784,818 B2 | * | 8/2004 | Mulder ........................ 341/154 |
| 2003/0085737 A1 | | 5/2003 | Tinsley et al. | |

FOREIGN PATENT DOCUMENTS

CN  1420625 A  5/2003

* cited by examiner

*Primary Examiner*—My-Trang Nu Ton
(74) *Attorney, Agent, or Firm*—McDermott Will & Emery LLP

(57) ABSTRACT

First, second and third current generators, and first and second switching devices are provided. Current values of the first and second current generators are equal to each other and a current value of the third current generator is twice as large as the current value of the first and second current generators. The first current generator and the third current generator are connected to each other through the first switching device, and the second current generator and the third current generator are connected to each other through the second switching device. A first output is taken out from a node between the first switching device and the first current generator, and a second output is taken out from a node between the second switching device and the second current generator.

9 Claims, 6 Drawing Sheets

SMALL-AMPLITUDE DIFFERENTIAL INTERFACE CIRCUIT

BACKGROUND OF THE INVENTION

The present invention relates to a small-amplitude differential interface circuit useful as a fast interface or the like between semiconductor devices.

According to technique disclosed in U.S. Pat. No. 5,418,478, a driver circuit for a small-amplitude differential interface is composed of two sourcing current generators, two sinking current generators and four switching devices. Alternatively, according to technique disclosed in U.S. Pat. No. 6,111,431, a driver circuit for a small-amplitude differential interface is composed of one sourcing current generator, one sinking current generator and four switching devices. In either technique, signals are transferred by switching the direction of an output current with an H bridge.

In order to reduce the voltage of a voltage source, the two switching devices disposed on the side of the sourcing current generators in U.S. Pat. No. 5,418,478 may be omitted so as to set the current values of the two sinking current generators to be double the current value of each sourcing current generator. However, if the both switching devices are simultaneously in an on-state in switching the polarity of the output, the relationship that a current sourced by external load capacitance is equivalent to a current sunk by the external load capacitance is spoiled, and therefore, the charge amount of the external load capacitance is changed, resulting in varying a DC (continuous current) level. When the DC level is varied, a margin against ground level variation between a transmitter and a receiver is reduced, which makes communications impossible in the worst case. Such a simultaneous on-state occurs when the polarity of the output is changed, and hence, the influence appears more seriously as the frequency of the output signal is higher. Since rapid switching is demanded, it is difficult to overcome this problem.

In the architecture disclosed in U.S. Pat. No. 6,111,431, although the DC level is not varied, since two switching devices are inserted in a current path, the voltage is largely lowered by these switching devices, which causes a problem when the supply voltage is to be lowered.

SUMMARY OF THE INVENTION

An object of the invention is overcoming these problems of the conventional techniques by providing a small-amplitude differential interface circuit having an architecture suitable to voltage lowering and free from DC level variation of an output signal.

In order to achieve the object, the small-amplitude differential interface circuit of this invention includes first, second and third current generators; and first and second switching devices, and current values of the first and second current generators are equal to each other and a current value of the third current generator is twice as large as the current value of the first and second current generators, the first current generator and the third current generator are connected to each other through the first switching device and the second current generator and the third current generator are connected to each other through the second switching device, and a first output is taken out from a node between the first switching device and the first current generator, and a second output is taken out from a node between the second switching device and the second current generator.

According to the present invention, the sum of currents flowing to the first current generator and the second current generator corresponds to the current value of the current flowing to the third current generator. Therefore, even when the first switching device and the second switching device are simultaneously in an on-state, the sum of a current sourced by external load capacitance and a current sunk by the external load capacitance is 0 (zero), and hence the charge amount is not changed. Accordingly, DC voltage variation accompanied by the change of output polarity does not occur.

In other words, the small-amplitude differential interface circuit of this invention can be operated at a low power voltage and is free from the DC level variation of the output signal. Furthermore, the small-amplitude differential interface circuit exhibits a good transition characteristic because none of the current generators is placed in an off-state and attains an effect to reduce the circuit area because the number of current generators is reduced from four to three.

DETAILED DESCRIPTION OF THE INVENTION

Now, preferred embodiments of the invention will be described with reference to the accompanying drawings.

Figure 1:
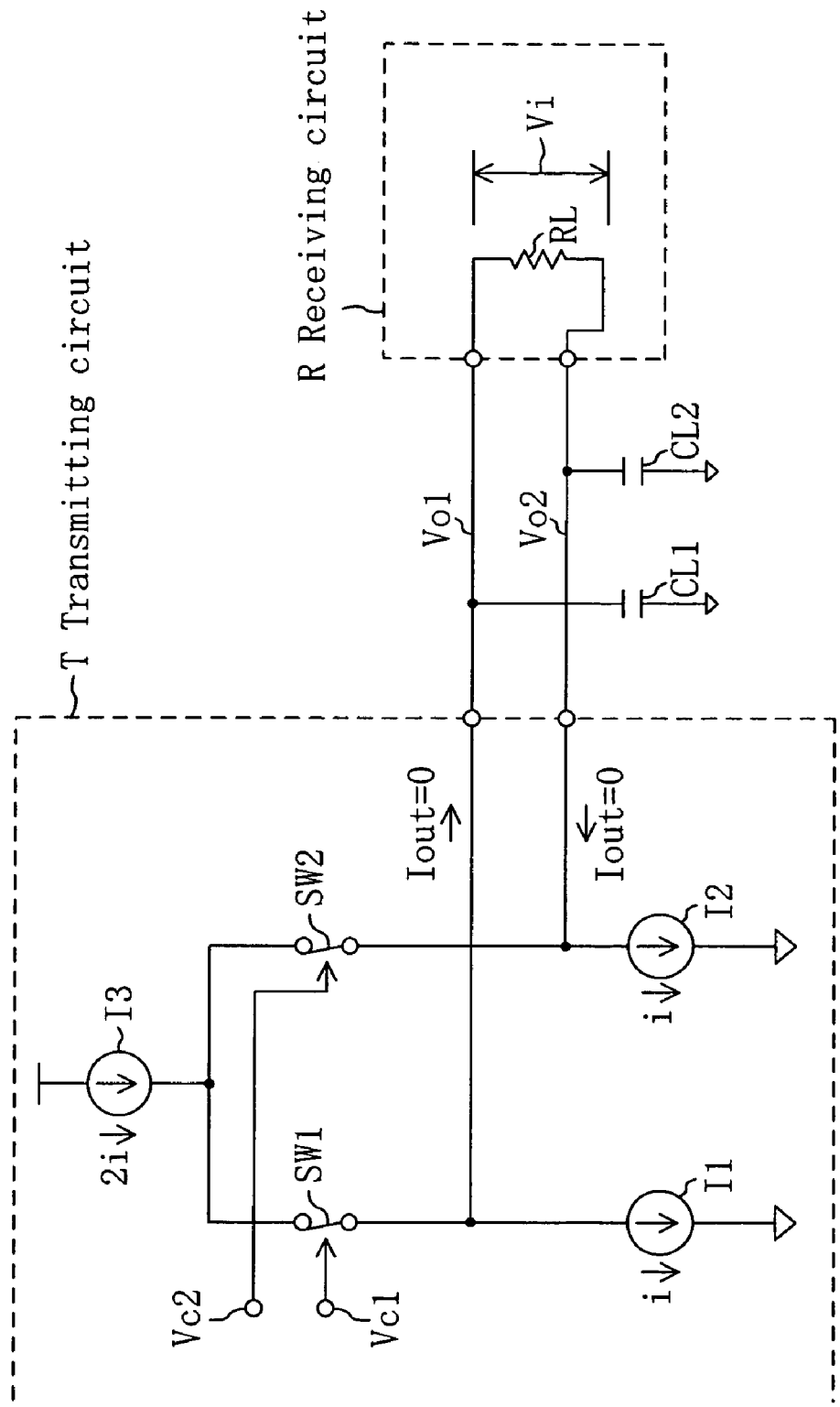
FIG. 1 is a schematic diagram of a small-amplitude differential interface circuit according to Embodiment 1 of the invention.
Figure 2:
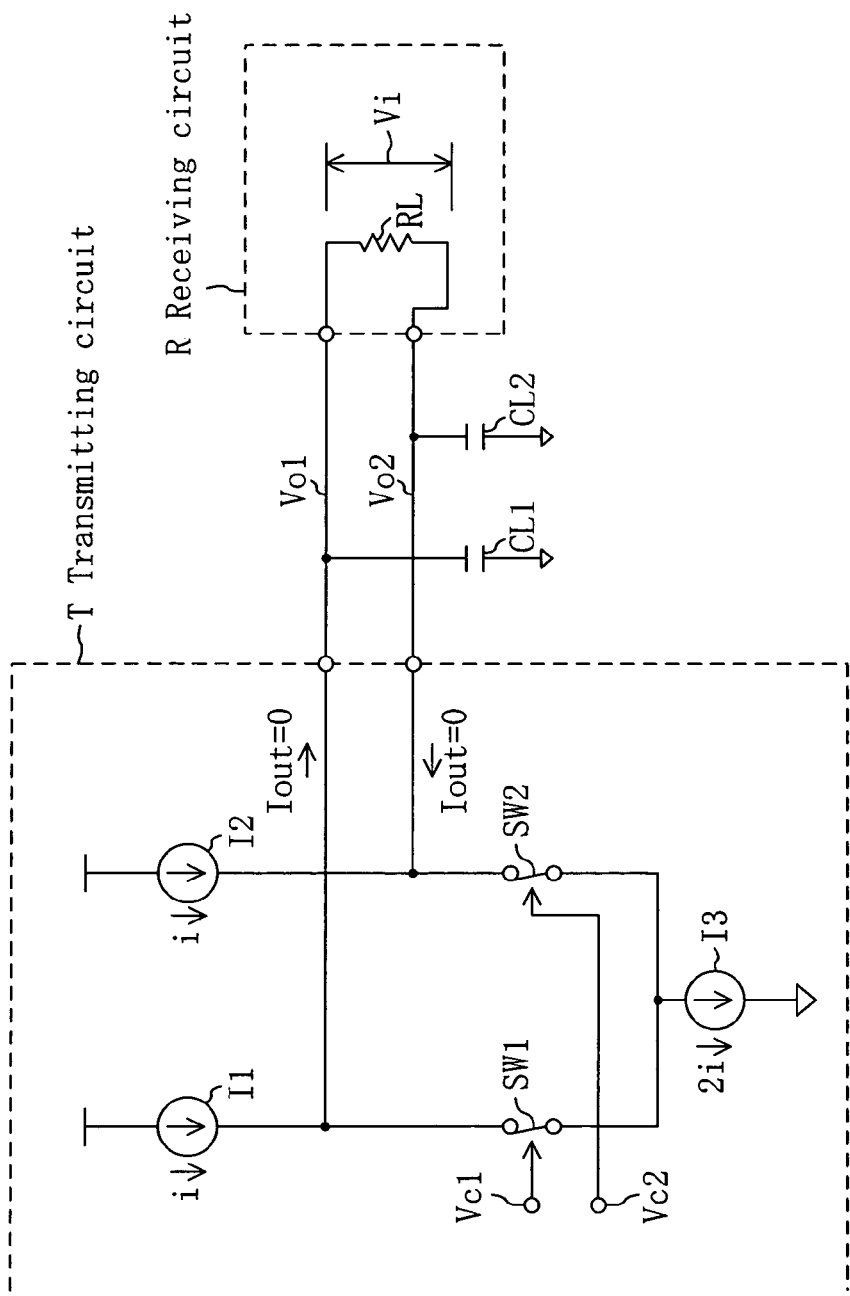
FIG. 2 is a schematic diagram of a small-amplitude differential interface circuit according to Embodiment 2 of the invention.

FIGS. 1 and 2 respectively show the rough architectures of small-amplitude differential interface circuits according to embodiments of the invention. In these drawings, T denotes a transmitting circuit, I1 denotes a first current generator, I2 denotes a second current generator, I3 denotes a third current generator, SW1 denotes a first switching device, SW2 denotes a second switching device, Vc1 denotes a first switching control voltage, Vc2 denotes a second switching control voltage, Vo1 denotes a first output, Vo2 denotes a second output, CL1 and CL2 denote load capacitances, R denotes a receiving circuit, RL denotes a load resistance, and Vi denotes a voltage generated at both ends of the load resistance RL.

The small-amplitude differential interface circuit may employ either the architecture as shown in FIG. 1 in which the third current generator I3 is connected on the power generating (sourcing) side and the first current generator I1 and the second current generator I2 are connected on the ground (sinking) side or the architecture as shown in FIG. 2 in which the first current generator I1 and the second current generator I2 are connected on the power generating (sourcing) side and the third current generator I3 is connected on the ground (sinking) side.

In the stationary state, merely one of the first switching device SW1 and the second switching device SW2 is in an off-state. When the first switching device SW1 is in an off-state, a current i passes through the load resistance RL to the first current generator I1 and the current i of the second current generator I2 passes within the transmitting circuit T to the third current generator I3. Similarly, when the second switching device SW2 is in an off-state, the current i passes through the load resistance RL to the second current generator I2 and the current i of the first current generator I1 passes within the transmitting circuit T to the third current generator I3. The direction of the current passing through the load resistance RL is reverse when the first switching device SW1 is in an off-state to that passing therethrough when the second switching device SW2 is in an off-state, and therefore, the receiving circuit R discriminates a signal on the basis of the voltage Vi generated at the both ends of the load resistance RL.

Furthermore, even when the first switching device SW1 and the second switching device SW2 are simultaneously in an on-state, the sum of a current sourced by and a current sunk by the load capacitances CL1 and CL2 is 0 (zero) as shown as "Iout=0" in FIGS. 1 and 2 and hence the charge amount is not changed. Therefore, DC level variation accompanied by change of output polarity does not occur.

Figure 3:
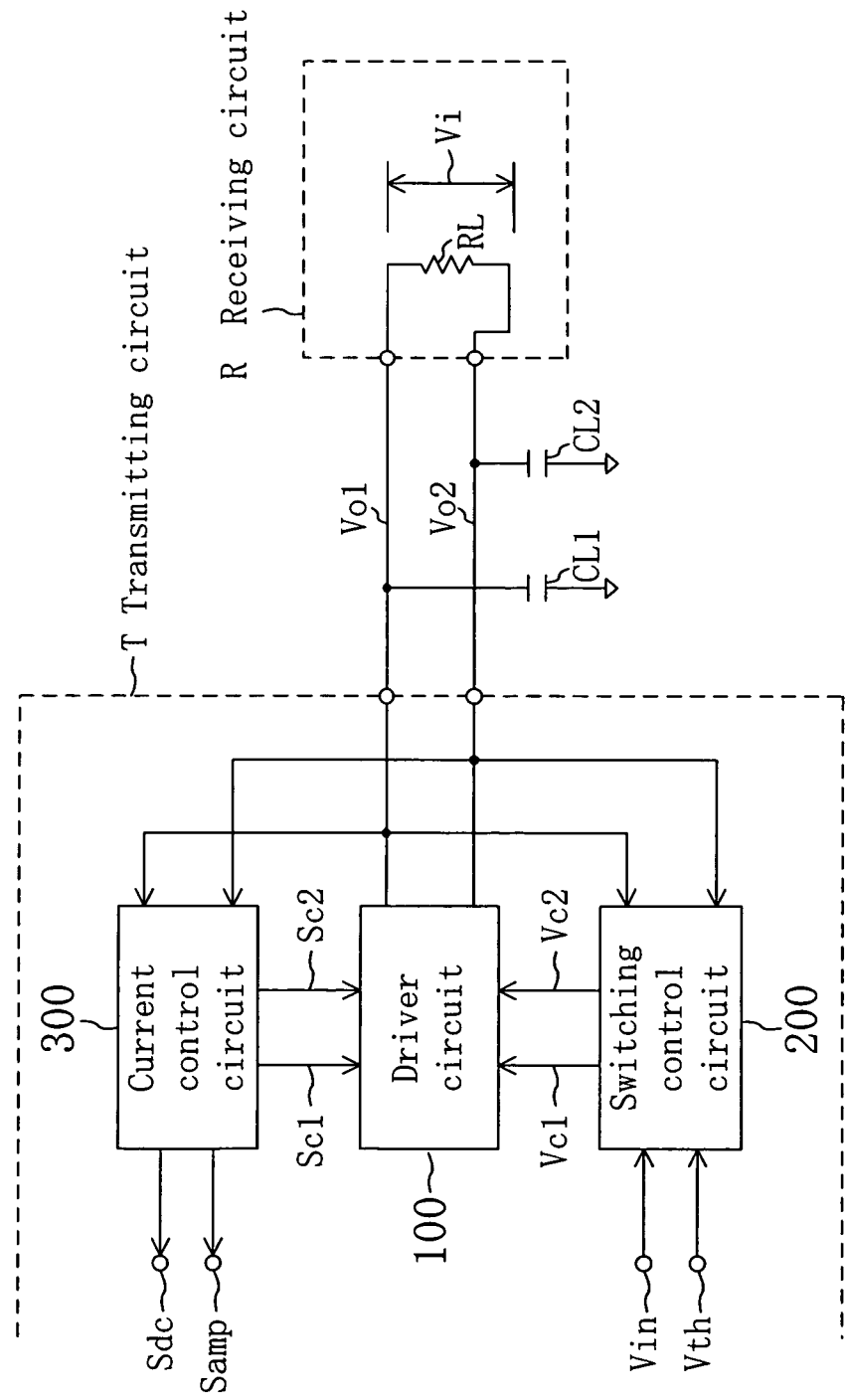
FIG. 3 is a block diagram for showing an exemplified detailed architecture of a transmitting circuit of FIG. 1.

FIG. 3 shows an exemplified detailed architecture of the transmitting circuit T of FIG. 1. In FIG. 3, a reference numeral 100 denotes a driver circuit, a reference numeral 200 denotes a switching control circuit, a reference numeral 300 denotes a current control circuit, Vin denotes a logic input voltage, Vth denotes a threshold voltage, Sc1 denotes a first current control signal, Sc2 denotes a second current control signal, Samp denotes an output amplitude monitoring signal, and Sdc denotes an output DC level monitoring signal.

Figure 4:
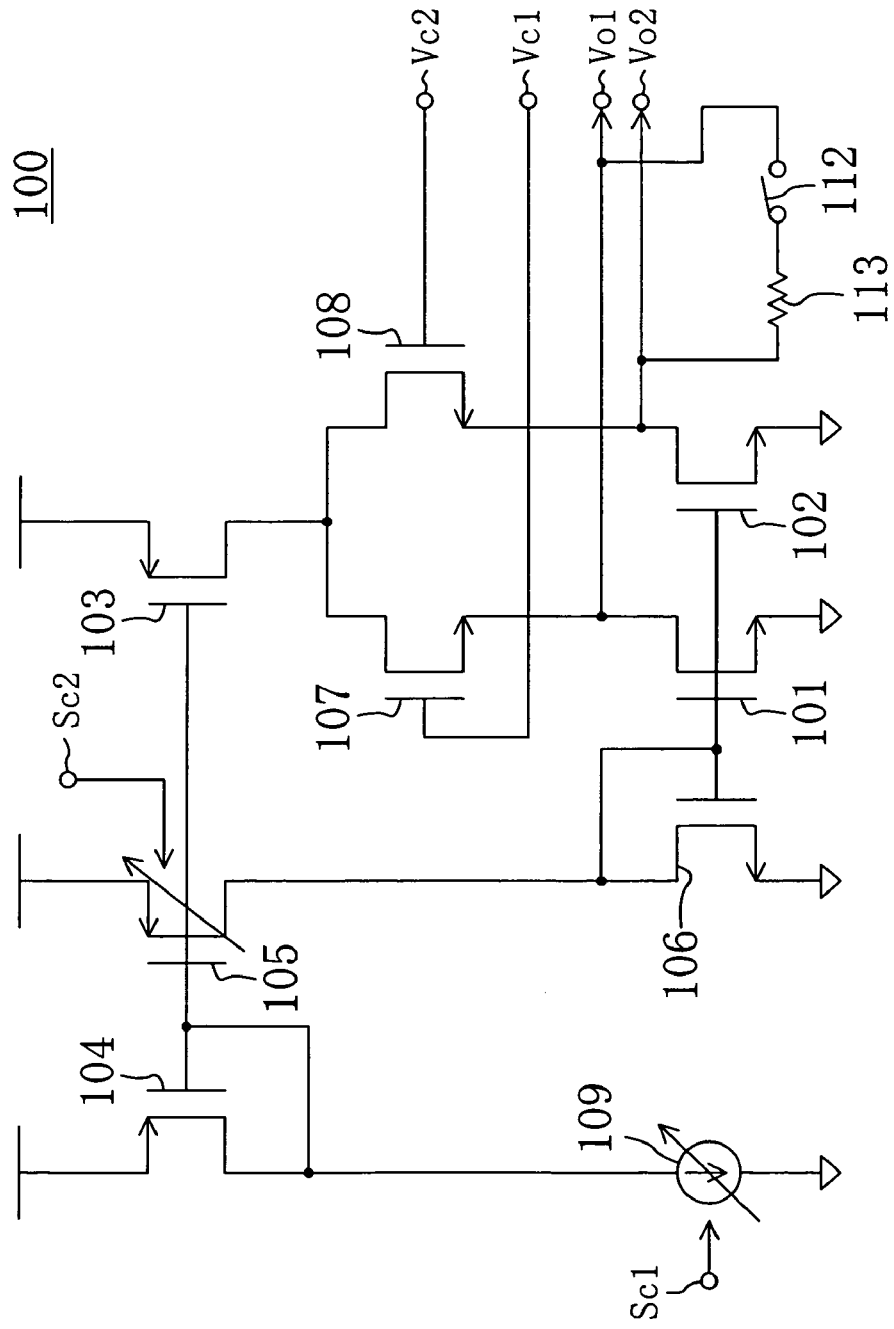
FIG. 4 is a circuit diagram for showing the internal configuration of a driver circuit of FIG. 3.

FIG. 4 shows an exemplified configuration of the driver circuit 100 of FIG. 3 obtained by CMOS process. The driver circuit 100 of FIG. 4 includes an N-channel MOS transistor (first current generating transistor) 101 serving as the first current generator (sinking current generator) I1, an N-channel MOS transistor (second current generating transistor) 102 serving as the second current generator (sinking current generator) I2, a P-channel MOS transistor (third current generating transistor) 103 serving as the third current generator (sourcing current generator) I3, an N-channel MOS transistor 107 serving as the first switching device SW1 and an N-channel MOS transistor 108 serving as the second switching device SW2 as well as a variable reference current generator 109 with a variable current value, first and second P-channel MOS transistors 104 and 105 and an N-channel MOS transistor 106 together constructing a current mirror circuit, and a switch 112 and a resistance 113 serially inserted between the outputs Vo1 and Vo2.

The variable reference current generator 109 is connected between the drain electrode of the first P-channel MOS transistor 104 and the ground, so as to allow the drain current of the first P-channel MOS transistor 104 to pass therethrough. The first P-channel MOS transistor 104 generates, from the current of the variable reference current generator 109, a gate voltage for operating the third current generating transistor 103. The second P-channel MOS transistor 105 generates, from a current value of the sourced current, a current for allowing to pass through the N-channel MOS transistor 106. The N-channel MOS transistor 106 generates a gate voltage for operating the first current generating transistor 101 and the second current generating transistor 102. The third current generating transistor 103 is connected to the power supply at its source electrode and is connected to the gate electrode of the first P-channel MOS transistor 104 at its gate electrode. The first P-channel MOS transistor 104 is connected to the power supply at its source electrode with its gate electrode connected to its own drain electrode. The second P-channel MOS transistor 105 having a variable gate size is connected to the gate electrode of the third current generating transistor 103 at its gate electrode, is connected to the power supply at its source electrode and is connected to the drain electrode of the N-channel MOS transistor 106 at its drain electrode. More specifically, the second P-channel MOS transistor 105 is composed of a plurality of P-channel MOS transistors connected to one another in parallel, and the number of active transistors out of these plural P-channel MOS transistors is controlled in accordance with the second current control signal Sc2.

The first current generating transistor 101 and the second current generating transistor 102 are grounded at their source electrodes, are connected to the gate electrode of the N-channel MOS transistor 106 at their gate electrodes and are respectively connected to the source electrodes of the first switching device 107 and the second switching device 108. The drain electrode of the first switching device 107 and the drain electrode of the second switching device 108 are both connected to the drain electrode of the third current generating transistor 103. The gate electrodes of the first switching device 107 and the second switching device 108 are respectively connected to the first and second switching control voltages Vc1 and Vc2. The first output Vo1 is connected to the source electrode of the first switching device 107 and the second output Vo2 is connected to the source electrode of the second switching device 108. Furthermore, the switch 112 and the resistance 113 serially connected to each other are inserted between the first output Vo1 and the second output Vo2.

In the configuration of FIG. 4, it is determined, in accordance with the control signals Vc1 and Vc2 supplied from the switching control circuit 200, which of the first switching device 107 and the second switching device 108 is to be turned on, thereby determining the direction of the current to be output. Also, the output current value is changed by changing the current value of the variable reference current generator 109, and the balance between the sunk current and the sourced current is adjusted by changing the gate size of the second P-channel MOS transistor 105. Furthermore, when the switch 112 is turned on, the resistance 113 is inserted between the first output Vo1 and the second output Vo2.

In the driver circuit 100 of FIG. 4, the output DC level is never varied even when both the first switching device 107 and the second switching device 108 are placed in an on-state. Also, the current value and the DC level of the output current are adjustable. In addition, since this driver circuit includes source follower circuits as the first and second switching devices 107 and 108, lowering of the switching speed derived from a mirror effect can be prevented, resulting in realizing a fast switching operation.

Furthermore, when the switch 112 serially connected to the resistance 113 is turned on, the resistance 113 is inserted in parallel to the load resistance RL, and thus, the value of the load resistance RL taken at its output end can be corrected. Therefore, variation of the amplitude value caused by variation of the resistance value on the receiver side can be suppressed. Moreover, even when the load resistance RL is not provided on the receiver side, the driver circuit 100 is applicable to a voltage-output type differential interface.

Figure 5:
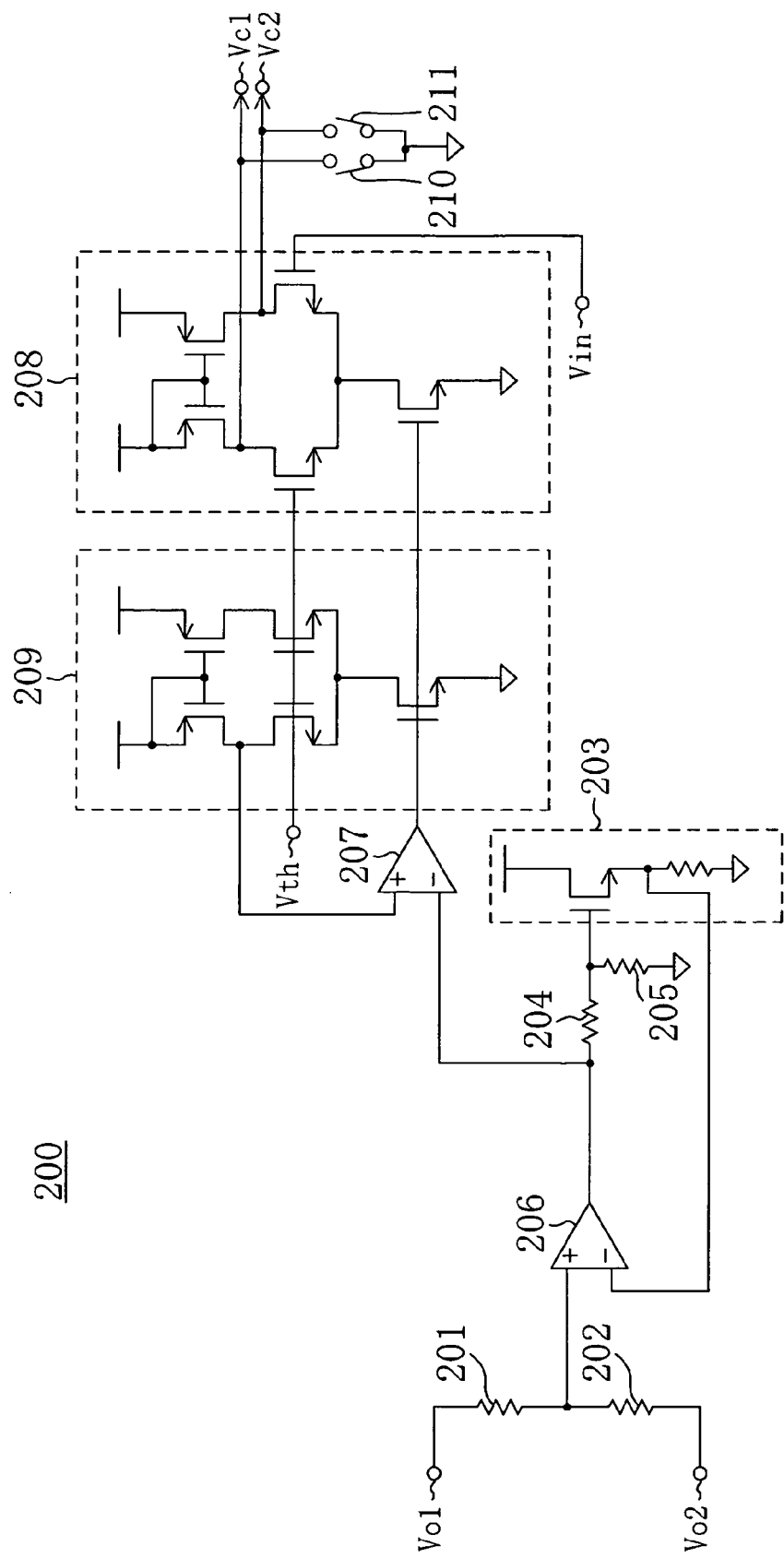
FIG. 5 is a circuit diagram for showing the internal configuration of a switching control circuit of FIG. 3.

FIG. 5 shows the internal configuration of the switching control circuit 200 of FIG. 3. The switching control circuit 200 of FIG. 5 includes two resistances 201 and 202 respectively connected to the first and second outputs Vo1 and Vo2 of the driver circuit 100; a source follower circuit 203 composed of a transistor equivalent to the first and second switching devices 107 and 108 of the driver circuit 100 and a resistance; a first differential amplifier 206 for accepting, as its inputs, a mid-point voltage between the first and second outputs Vo1 and Vo2 generated through voltage division by the two resistances 201 and 202 and the output voltage of the source follower circuit 203; a first differential amplifier circuit 208 for supplying the switching control voltages Vc1 and Vc2 to the driver circuit 100; a second differential amplifier circuit 209 equivalent to the first differential amplifier circuit 208 and having a short-circuit between differential inputs; a second differential amplifier 207 for accepting, as its inputs, the output of the second differential amplifier circuit 209 and the output of the first differential amplifier 206; and two resistances 204 and 205 for dividing the output voltage of the first differential amplifier 206 and supplying the divided voltage to the source follower circuit 203.

The gate input of the source follower circuit 203 corresponds to a voltage obtained by dividing the output of the first differential amplifier 206 by the two resistances 204 and 205, and the bias currents for the first and second differential amplifier circuits 208 and 209 are controlled in accordance with the output of the second differential amplifier 207. The both inputs of the second differential amplifier circuit 209 and one input of the first differential amplifier circuit 208 are connected to the common threshold voltage Vth, and the other input of the first differential amplifier circuit 208 is connected to the logic input voltage Vin. In other words, either the first or second switching control voltages Vc1 or Vc2 is selected depending upon whether the logic input voltage Vin is higher or lower than the threshold voltage Vth, so as to determine which of the first switching device 107 and the second switching device 108 is to be turned on.

When the switching control voltages Vc1 and Vc2 are equal to each other, these switching control voltages Vc1 and Vc2 are also equal to the output voltage of the second differential amplifier circuit 209. The output voltage of the second differential amplifier circuit 209 is feedback controlled by the second differential amplifier 207, and the output voltage value is equal to the output voltage value of the first differential amplifier 206. Furthermore, the output voltage of the first differential amplifier 206 is feedback controlled so that the output voltage of the source follower circuit 203 can be equal to the mid-point voltage between the first and second outputs Vo1 and Vo2.

The transistor included in the source follower circuit 203 is equivalent to the first and second switching devices 107 and 108 of the driver circuit 100, and therefore, the gate voltage of the source follower circuit 203 is lower by a half of the output amplitude than the gate voltage of either the first switching device 107 or the second switching device 108 having a higher source voltage. The output voltage of the first differential amplifier 206 is a voltage obtained by multiplying the gate potential of the source follower circuit 203 by an inverse number of the division ratio of the voltage divider circuit composed of the two resistances 204 and 205. Therefore, the division ratio is set so that the voltage can be higher than the gate voltage of either the first switching device 107 or the second switching device 108 having the higher source voltage.

Also, for a time when the communication is not performed, the switching control circuit 200 is connected to a switch 210 for forcedly setting the first switching control voltage Vc1 to the ground level and a switch 211 for forcedly setting the second switching control voltage Vc2 to the ground level.

In using the switching control circuit 200 having the configuration shown in FIG. 5, even when the voltage for placing the first and second switching devices 107 and 108 in an on-state is changed owing to the fabrication variation of the transistors and the temperature change, the voltage is followed by the gate potential of the source follower circuit 203 including the equivalent transistor, and as a result, it is followed by the output voltage of the first differential amplifier 206. Therefore, it is also followed by the voltage value obtained when the first switching control voltage Vc1 and the second switching control voltage Vc2 are equal to each other. Thus, this voltage value can be kept at a voltage higher by a constant voltage value than the voltage for placing the first and second switching devices 107 and 108 in an on-state.

Furthermore, both the first and second switching devices 107 and 108 can be placed in an off-state by the switches 210 and 211. Thus, the DC level is changed when the communication is not performed, so as to inform the receiver side that the communication line is not used, and thus, the receiving circuit R can be placed in a power down state.

Figure 6:
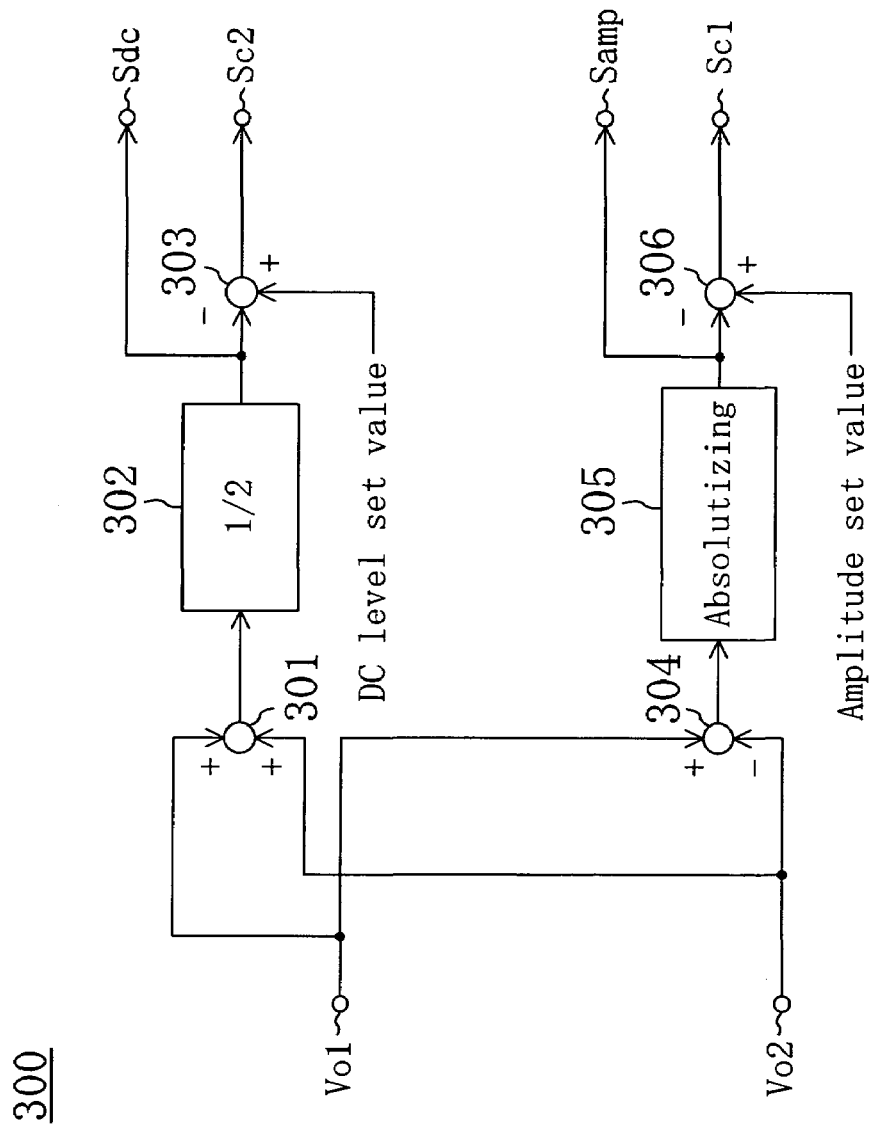
FIG. 6 is a circuit diagram for showing the internal configuration of a current control circuit of FIG. 3.

FIG. 6 shows the internal configuration of the current control circuit 300 of FIG. 3. In FIG. 6, a reference numeral 301 denotes an adder, reference numerals 303, 304 and 306 denote subtracters, a reference numeral 302 denotes an operator for multiplying by ½, and a reference numeral 305 denotes an operator for obtaining an absolute value.

The current control circuit 300 of FIG. 6 has a function to accept, as its inputs, the first and second outputs Vo1 and Vo2 of the driver circuit 100 and to output the output DC level monitoring signal Sdc, the output amplitude monitoring signal Samp, the first current control signal Sc1 for adjusting the current value of the variable reference current generator 109 of the driver circuit 100, and the second current control signal Sc2 for changing the gate size of the second P-channel MOS transistor 105 of the driver circuit 100.

The output DC level monitoring signal Sdc is obtained by multiplying, by ½, the sum of the first output Vo1 and the second output Vo2 of the driver circuit 100, and a difference between a DC level set value and the output DC level monitoring signal Sdc is used as the second current control signal Sc2 for changing the gate size of the second P-channel MOS transistor 105. Also, the output amplitude monitoring signal Samp corresponds to a difference in the voltage between the first output Vo1 and the second output Vo2 of the driver circuit 100, and a difference between an amplitude set value and the output amplitude monitoring signal Samp is output as the first current control signal Sc1 for adjusting the current value of the variable reference current generator 109. The voltage values of the first output Vo1 and the second output Vo2 are obtained and calculation through addition, subtraction and the like is performed by using an AD converter and an arithmetic circuit.

When the current control circuit 300 having the configuration of FIG. 6 is used, the output current can be adjusted and the balance between the current sunk and the current sourced by the load capacitances CL1 and CL2 can be adjusted. Therefore, the output amplitude and the DC level can be changed. In addition, the transmitting circuit T can attain a self-diagnosis function.

As described above, according to the present invention, the first and second switching devices 107 and 108 can be prevented from being simultaneously in an off-state during transition when the output polarity is changed, and therefore, the DC level can be prevented from varying. In addition, in switching the polarity of the output, time duration when the first and second switching devices 107 and 108 are both in an on-state can be made constant regardless of the control voltage for causing the on-state, and therefore, the transition characteristic of the time when the output is changed can be kept constant.

Furthermore, even in the case where the resistance value of the load resistance RL is changed in accordance with the impedance of a transmission line, the current can be controlled in accordance with the resistance value, resulting in obtaining an optimum amplitude value. Moreover, when the load resistance RL is included in the receiving circuit R, variation of the resistance value caused through the process can be cancelled. In addition, since the DC level can be freely set, the variation of the DC level derived from variation in the process or the like can be cancelled.

As described so far, the small-amplitude differential interface circuit of the present invention has characteristics that it is operated at a low power voltage and has a large allowable range against semiconductor process variation, and hence is useful as a rapid interface between semiconductor devices. Also, it is applicable to an interface between apparatuses requiring rapid communication means.

What is claimed is:

1. A small-amplitude differential interface circuit comprising:
    first, second and third current generators;
    first and second switching devices, and
    a controlling device to place both of said first and second switching devices in an on-state when a control voltage for said first switching device and a control voltage for said second switching device are equal to each other in transition when output polarity is changed,
    wherein current values of said first and second current generators are equal to each other and a current value of said third current generator is twice as large as the current value of said first and second current generators,
    said first current generator and said third current generator are connected to each other through said first switching device and said second current generator and said third current generator are connected to each other through said second switching device, and
    a first output is taken out from a node between said first switching device and said first current generator, and
    a second output is taken out from a node between said second switching device and said second current generator,
    wherein said first and second switching devices operate in a saturation region when in said on-state.

2. The small-amplitude differential interface circuit of claim 1, wherein said first and second switching devices both have a source follower configuration.

3. The small-amplitude differential interface circuit of claim 1, further comprising means for changing, when a control voltage for placing said first switching device in an on-state and a control voltage for placing said second switching device in an on-state are varied, the control voltages of said first and second switching devices to follow the variation.

4. The small-amplitude differential interface circuit of claim 1, further comprising means for adjusting the current values of said first, second and third current generators.

5. The small-amplitude differential interface circuit of claim 1, further comprising means for reading potentials of said first and second outputs and supplying an output amplitude monitoring signal and an output DC level monitoring signal.

6. The small-amplitude differential interface circuit of claim 5, further comprising means for adjusting the current values of said first, second and third current generators in accordance with said output amplitude monitoring signal.

7. The small-amplitude differential interface circuit of claim 5, further comprising means for adjusting balance among the current values of said first, second and third current generators in accordance with said output DC level monitoring signal.

8. The small-amplitude differential interface circuit of claim 1, further comprising means for placing both of said first and second switching devices in an off-state when communication is not performed.

9. The small-amplitude differential interface circuit of claim 1, further comprising, between said first output and said second output, a series circuit composed of a switch and a resistance.

* * * * *